(12) United States Patent
Chen et al.

(10) Patent No.: US 11,606,862 B2
(45) Date of Patent: Mar. 14, 2023

(54) CIRCUIT BOARD, METHOD FOR MANUFACTURING THE SAME

(71) Applicants: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

(72) Inventors: Po-Yuan Chen, New Taipei (TW); Yong-Chao Wei, Qinhuangdao (CN)

(73) Assignees: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/330,982

(22) Filed: May 26, 2021

(65) Prior Publication Data
US 2022/0369467 A1    Nov. 17, 2022

(30) Foreign Application Priority Data

May 14, 2021 (CN) .......................... 202110527146.1

(51) Int. Cl.
| H05K 1/03 | (2006.01) |
| H05K 3/00 | (2006.01) |
| H05K 3/28 | (2006.01) |

(52) U.S. Cl.
CPC ............. *H05K 3/0085* (2013.01); *H05K 1/03* (2013.01); *H05K 3/0023* (2013.01); *H05K 3/287* (2013.01); *H05K 2201/0183* (2013.01); *H05K 2201/09036* (2013.01)

(58) Field of Classification Search
CPC .......... H05K 1/111–114; H05K 3/0023; H05K 3/106
See application file for complete search history.

(56) References Cited

U.S. PATENT DOCUMENTS

2019/0246496 A1*  8/2019  Wu .......................... H01L 24/11

FOREIGN PATENT DOCUMENTS

TW    I544584 B    8/2016

* cited by examiner

*Primary Examiner* — Jeremy C Norris
(74) *Attorney, Agent, or Firm* — ScienBiziP, P.C.

(57) ABSTRACT

A circuit board includes a circuit substrate, at least one metal pad, and a tin bar corresponding to each of the at least one metal pad. Each of the at least one metal pad is formed on a side of the circuit substrate and is electrically connected to the circuit substrate. A surface of the metal pad facing away from the circuit substrate is recessed toward the circuit substrate to from a recess. The tin bar is received in the recess. A method for manufacturing a circuit board is also provided.

9 Claims, 13 Drawing Sheets

| Press a dielectric layer on second photosensitive film and form a connecting hole corresponding each metal pad on the dielectric layer | ─ 471 |

↓

| Form a conductive pillar in the connecting hole | ─ 472 |

↓

| Form a wiring layer on the dielectric layer | ─ 473 |

CIRCUIT BOARD, METHOD FOR MANUFACTURING THE SAME

FIELD

The subject matter herein generally relates to a circuit technology, especially relates to a circuit board and a method of manufacturing the circuit board.

BACKGROUND

With the development of the electronic products, sizes of the electronic products are becoming smaller. Correspondingly, an important element in the electronic products, the circuit board needs to be smaller. So that connecting pads and wiring spacings of the circuit board also need to become smaller, which makes coating of solder paste with precisions become more difficult.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
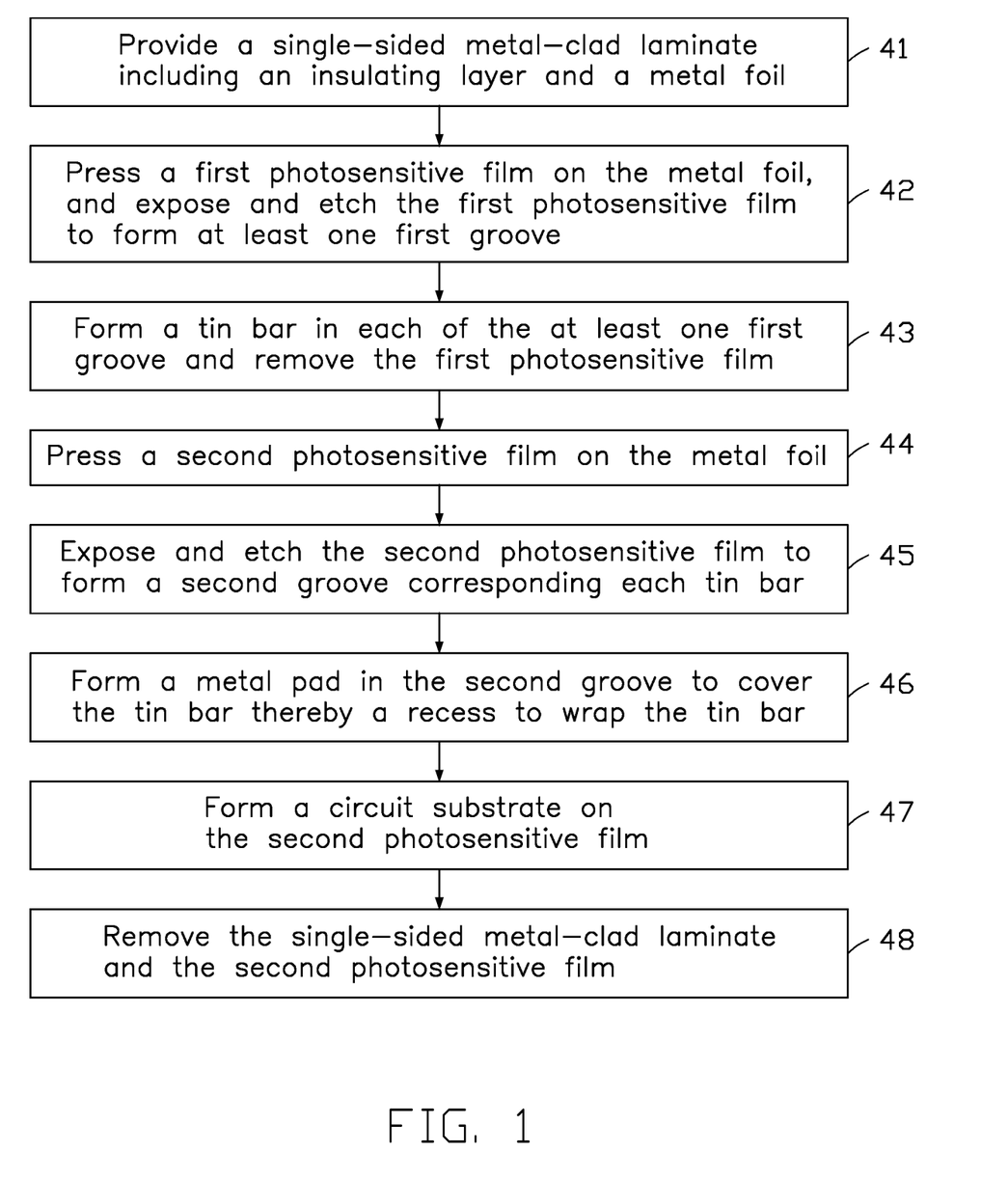
FIG. 1 is a flowchart of a first embodiment of a method for manufacturing a circuit board according to the present disclosure.

FIG. 1 illustrates a flowchart of a method in accordance with a first embodiment. The embodiment method for manufacturing a circuit board is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The first embodiment method can begin at block 41.

Figure 2:
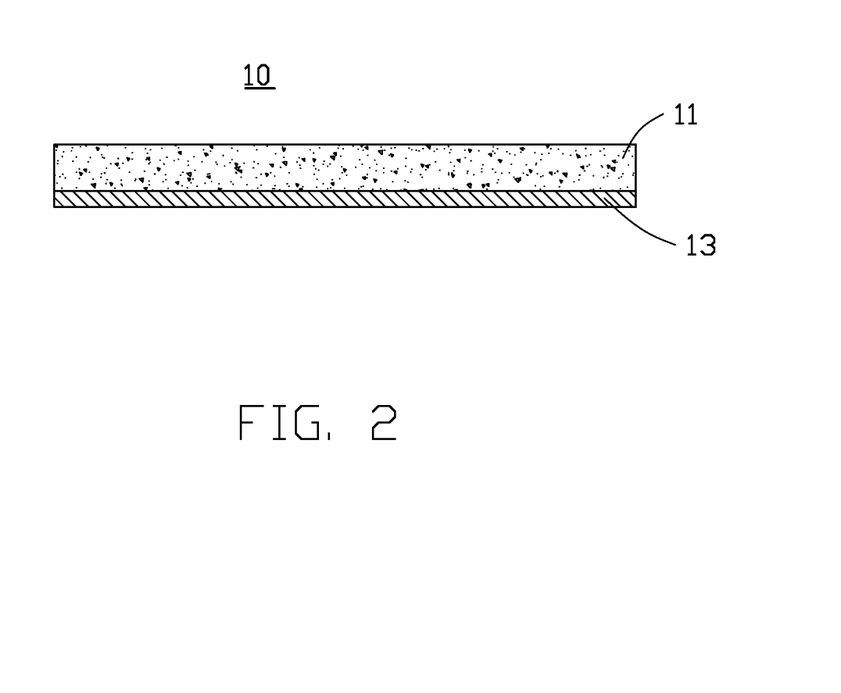
FIG. 2 is a cross-sectional view of an embodiment of a single-sided metal-clad laminate according to the present disclosure.

At block 41, referring to FIG. 2, a single-sided metal-clad laminate 10 is provided. The single-sided metal-clad laminate 10 includes an insulating layer 11 and a metal foil 13 formed om a side of the insulating layer 11.

The insulating layer 11 is made of a dielectric material commonly used in the art, such as polyimide, or epoxy resin. The metal foil 13 may include but is not limited to copper, gold, silver and the like. In at least one embodiment, the metal foil 13 may be a thin copper layer.

Figure 3:
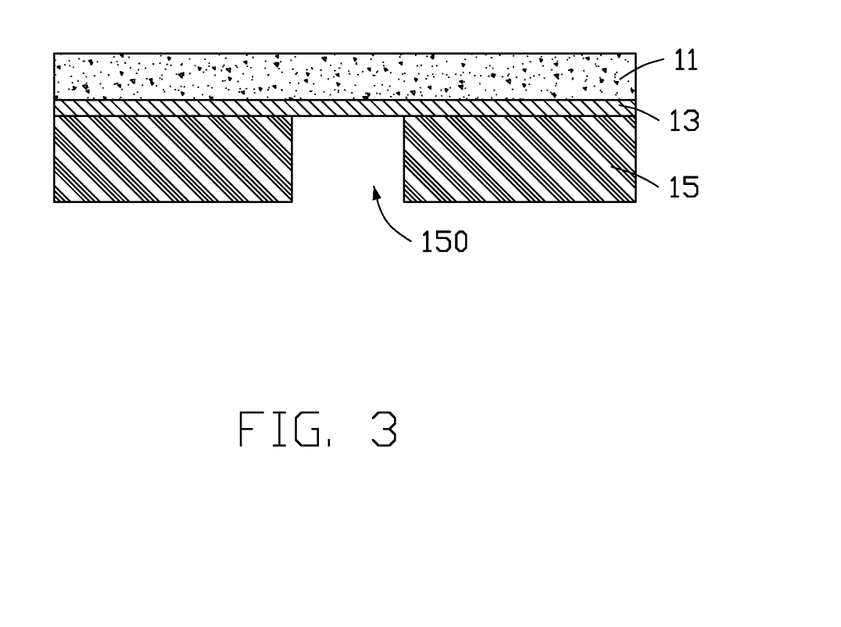
FIG. 3 is a cross-sectional view showing a first photosensitive film with at least one first groove on the single-sided metal-clad laminate of FIG. 2.

At block 42, referring to FIG. 3, a first photosensitive film 15 is pressed on a side of the metal foil 13 facing away from the insulating layer 11, and is exposed and etched to form at least one first groove 150. A portion of the metal foil 13 is exposed from the at least one first groove 150.

In at least one embodiment, a first groove 150 is taken as an example for subsequent description. In at least one embodiment, a plurality of first grooves 150 arranged at intervals may be formed on the first photosensitive film 15.

Figure 4:
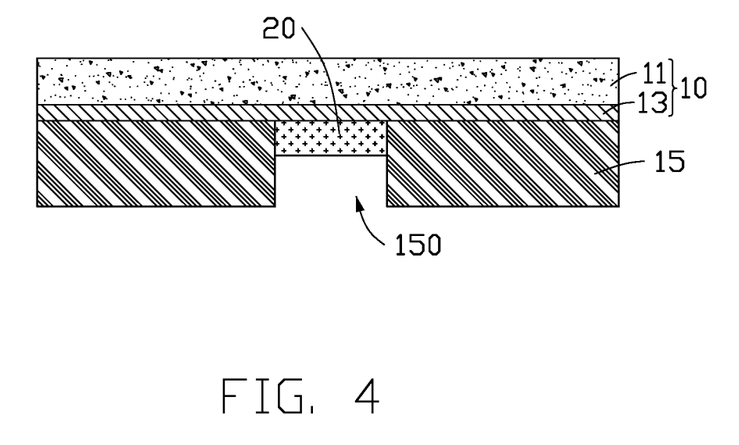
FIG. 4 is a cross-sectional view showing a tin bar in each of the at least one first groove of FIG. 3.
Figure 5:
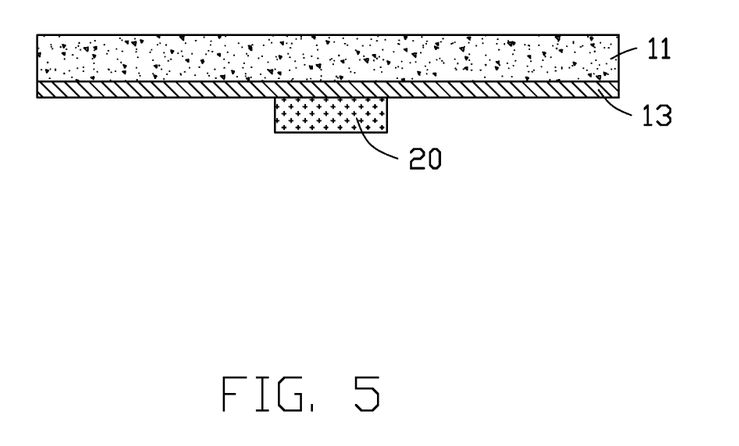
FIG. 5 is a cross-sectional view showing the first photosensitive film removed from the single-sided metal-clad laminate of FIG. 4.

At block 43, referring to FIGS. 4 and 5, a tin bar 20 is formed in each of the at least one first groove 150 by plating tin, and then the first photosensitive film 15 is removed.

In at least one embodiment, a height of the tin bar 20 may be preferably less than a depth of the first groove 150 receiving the tin bar 20, which is beneficial to the flatness of a shape of the tin bar 20. In at least one embodiment, a surface of the tin bar 20 facing away from the metal foil 13 may be flush with a surface of the first photosensitive film 15 facing away from the metal foil 13.

Figure 6:
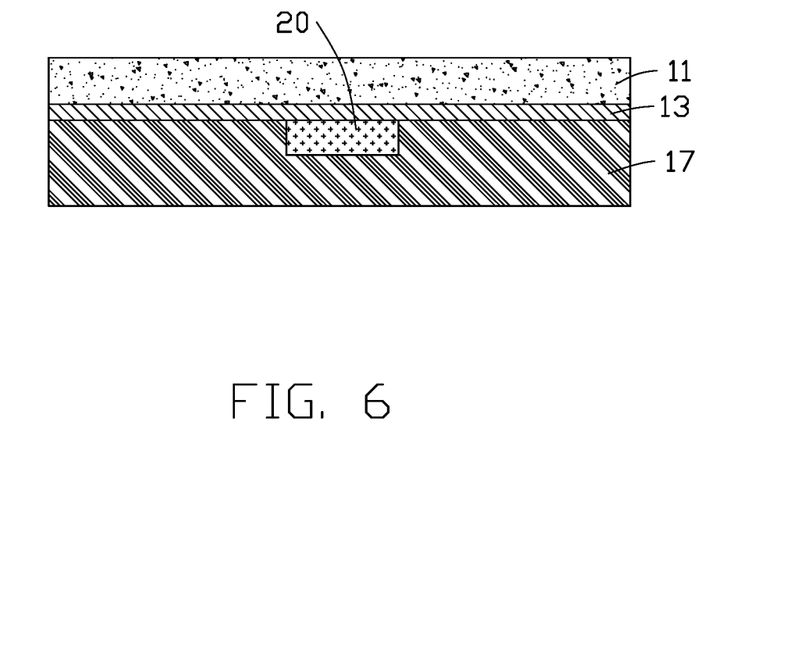
FIG. 6 is a cross-sectional view showing a second photosensitive film on the single-sided metal-clad laminate of FIG. 5.

At block 44, referring to FIG. 6, a second photosensitive film 17 is pressed on the side of the metal foil 13 facing away from the insulating layer 11. The tin bar 20 is covered by the second photosensitive film 17.

Figure 7:
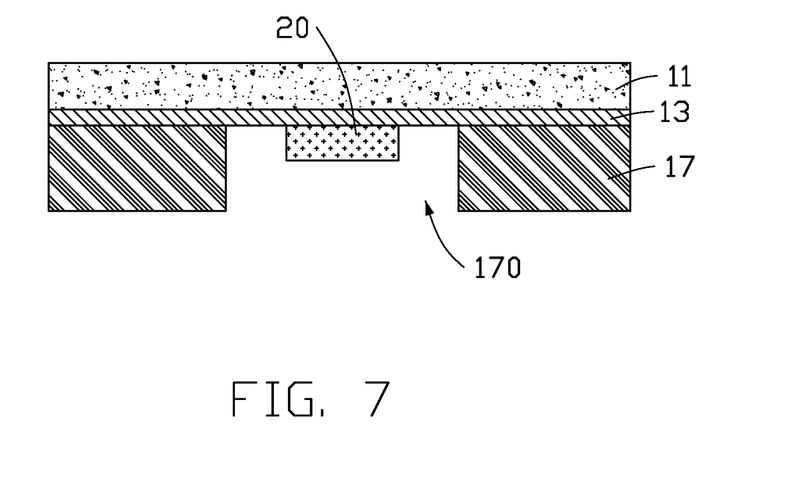
FIG. 7 is a cross-sectional view showing a second groove on the second photosensitive film of FIG. 6.

At block 45, referring to FIG. 7, the second photosensitive film 17 is exposed and etched to form a second groove 170 corresponding each tin bar 20. The tin bar 20 is exposed from the second groove 170, and the tin bar 20 is spaced from the exposed and etched second photosensitive film 17.

Figure 8:
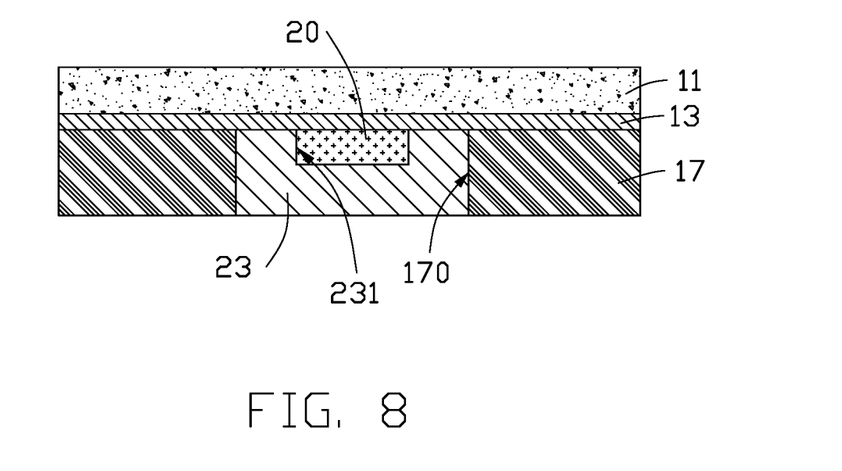
FIG. 8 is a cross-sectional view showing a metal pad in the second groove of FIG. 7.

At block 46, referring to FIG. 8, a metal pad 23 is formed in the second groove 170 by plating metal. The metal pad 23 fills between the tin bar 20 and the second photosensitive film 17 and covers the tin bar 20 thereby forming a recess 231 to wrap the tin bar 20.

In at least one embodiment, capper is plated in the second groove 170 to form a copper pad as the metal pad 23. In at least one embodiment, the metal pad 23 may be made of other conductive metals.

In at least one embodiment, the metal pad 23 may preferably not protrude from the second groove 170, so as to facilitate the flatness of a shape of the metal pad 23.

Figure 9:
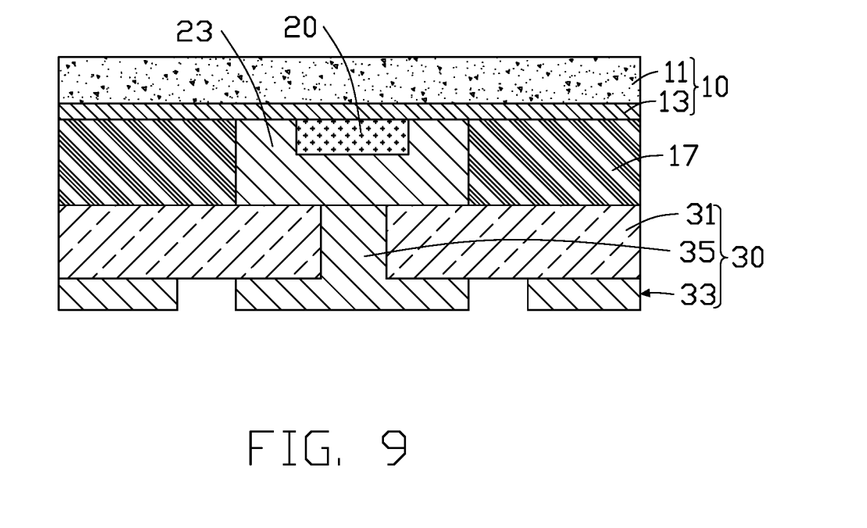
FIG. 9 is a cross-sectional view showing a circuit substrate on the second photosensitive film of FIG. 8.

At block 47, referring to FIG. 9, a circuit substrate 30 is formed on a side of the second photosensitive film 17 facing away from the single-sided metal-clad laminate 10 to be connected to metal pad 23.

In at least one embodiment, the circuit substrate 30 may include a dielectric layer 31, a wiring layer 33, and a conductive pillar 35. The dielectric layer 31 is interposed between the wiring layer 33 and the second photosensitive film 17. The conductive pillar 35 is buried in the dielectric layer 31 and electrically connects the wiring layer 33 and the metal pad 23.

In the illustrated embodiment, the circuit substrate 30 is single-layer wiring board. In at least one embodiment, the circuit substrate 30 may be a double-layer wiring board or multi-layer wiring board, that is, the circuit substrate 30 may include other wiring layers besides the wiring layer 33.

Figure 10:
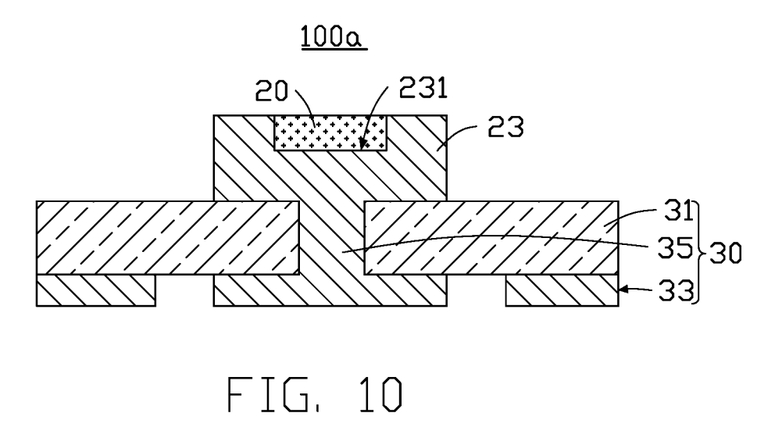
FIG. 10 is a cross-sectional view of a first embodiment of a circuit board according to the present disclosure.

At block 48, referring to FIG. 10, the single-sided metal-clad laminate 10 and the second photosensitive film 17 on the circuit substrate 30 are removed, thereby obtaining the circuit board 100a.

Specifically, the insulating layer 11 may be separated and removed first, then the metal foil 13 may be removed by means of rapid etching, and the second photosensitive film 17 may be peeled off finally.

Figure 11:
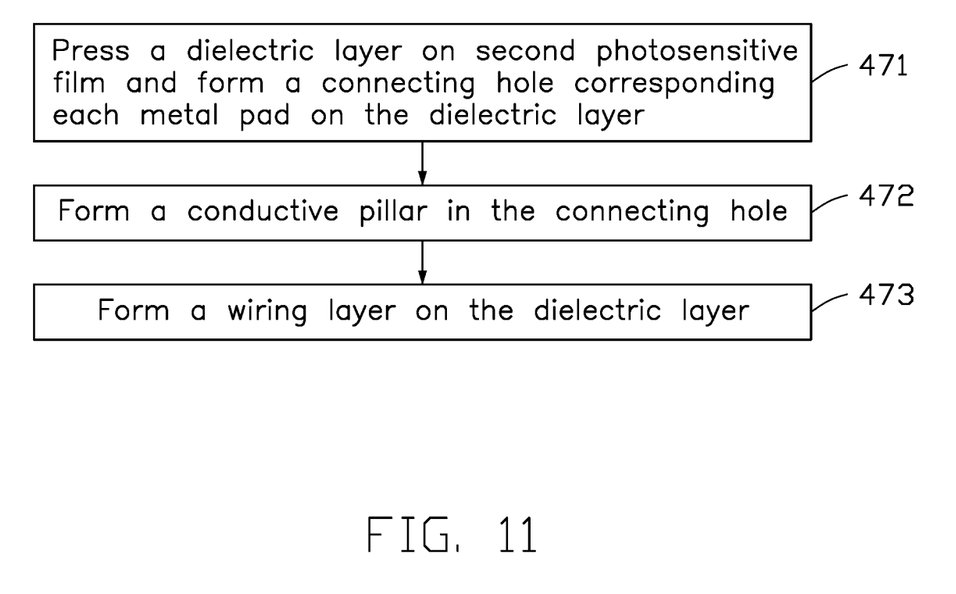
FIG. 11 is a flowchart of an embodiment of a method for manufacturing a circuit substrate according to the present disclosure.

FIG. 11 illustrates a flowchart of an embodiment of a method for manufacturing the circuit substrate 30. The method can begin at block 471.

Figure 12:
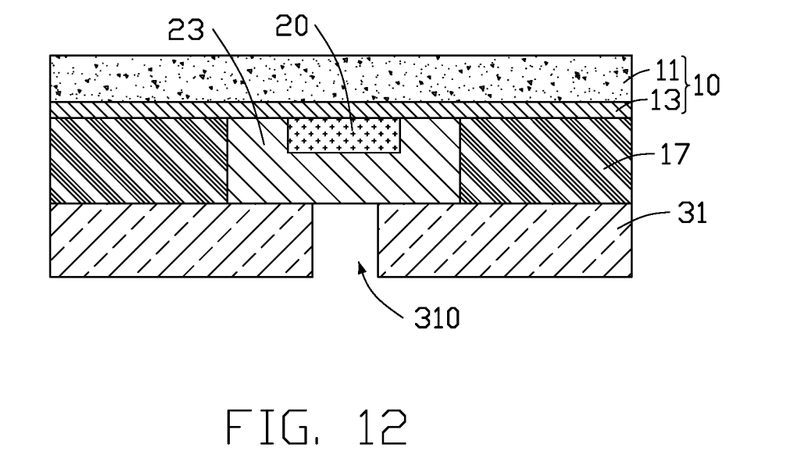
FIG. 12 is a cross-sectional view showing a dielectric layer with a connecting hole on the second photosensitive film of FIG. 8.

At block 471, referring to FIG. 12, a dielectric layer 31 is pressed on a side of the second photosensitive film 17 facing away from the single-sided metal-clad laminate 10, and a connecting hole 310 corresponding each metal pad 23 is formed on the dielectric layer 31 to expose a portion of the metal pad 23.

Preferably, the connecting hole 310 may be formed corresponding to a center area of the metal pad 23.

Figure 13:
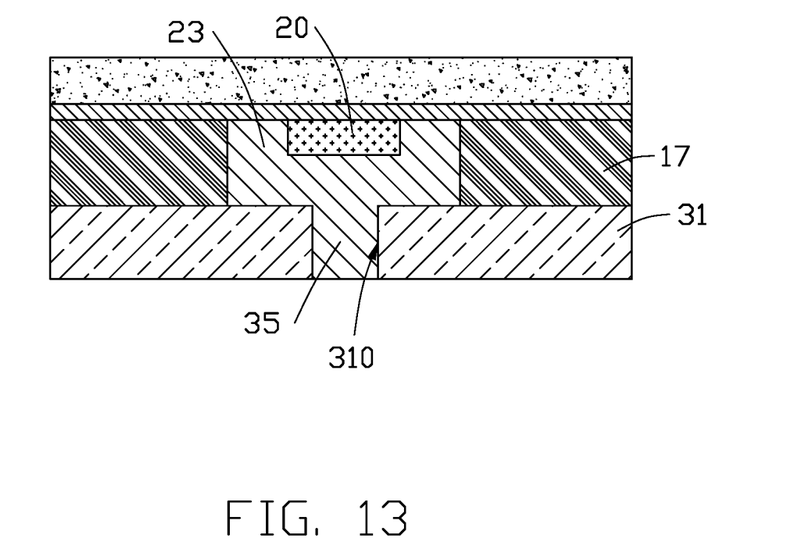
FIG. 13 is a cross-sectional view showing a conductive pillar in the connecting hole of FIG. 12.

At block 472, referring to FIG. 13, a conductive pillar 35 is formed in the connecting hole 310 to fill the connecting hole 310 and be connected to the metal pad 23.

The conductive pillar 35 may be formed by, but not limited to, electroplating.

At block 473, referring to FIG. 9, a wiring layer 33 is formed on a side of the dielectric layer 31 facing away from the second photosensitive film 17, and is electrically connected to the conductive pillar 35.

A second embodiment method for manufacturing a circuit board 100b (shown in FIG. 14) is provided. The difference from the first embodiment is that, referring to FIG. 14, after removing the single-sided metal-clad laminate 10 and the second photosensitive film 17 on the circuit substrate 30, the method further includes removing a portion of the tin bar 20 to reduce a thickness of the tin bar 20. So that the thickness of the tin bar 20 is less than a depth of the recess 231. In at least one embodiment, the portion of the tin bar 20 may be removed by etching.

Figure 15:
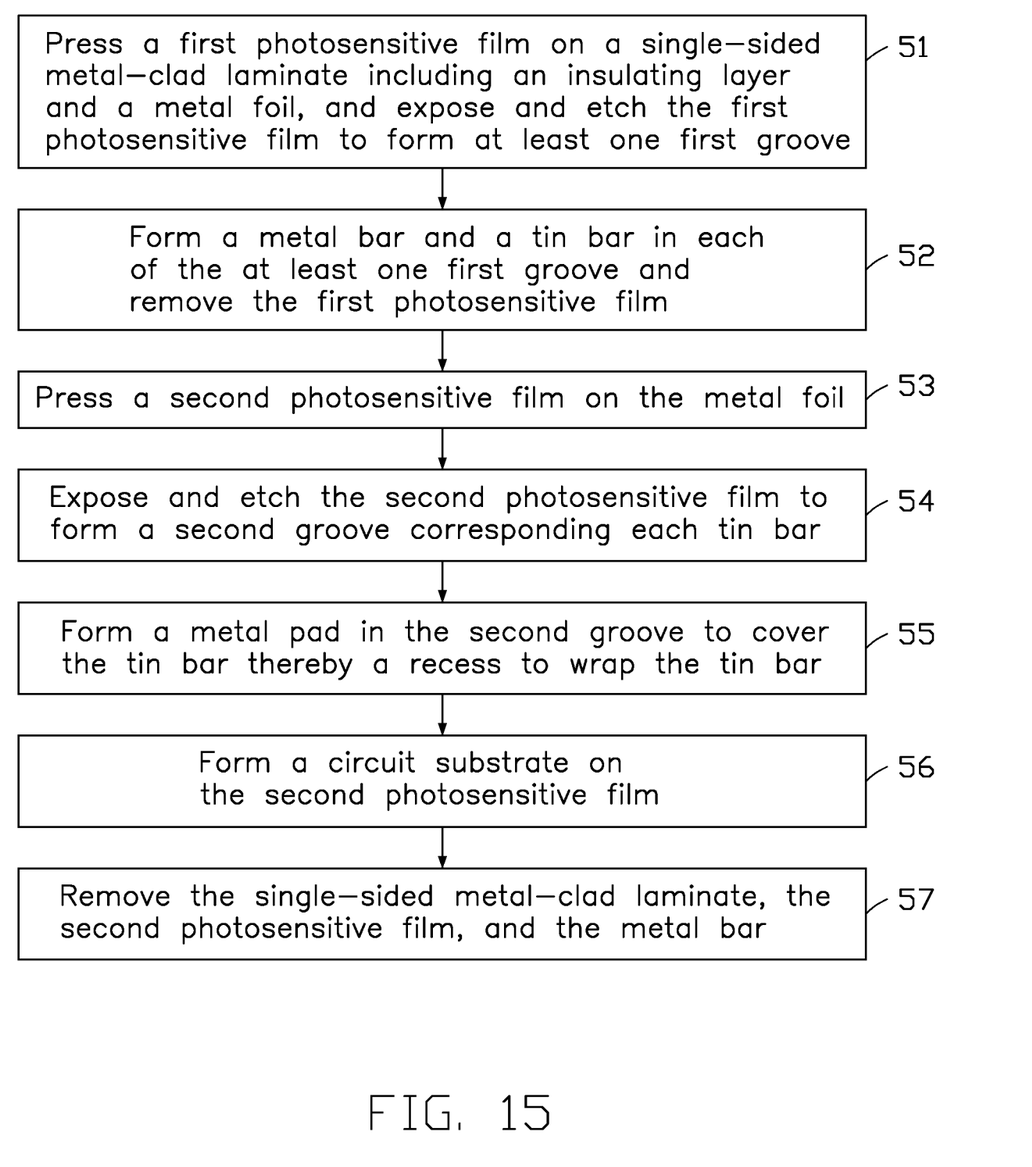
FIG. 15 is a flowchart of a third embodiment of a method for manufacturing a circuit board according to the present disclosure.

FIG. 15 illustrates a flowchart of a method in accordance with a third embodiment. The third embodiment method for manufacturing a circuit board is provided by way of embodiments, as there are a variety of ways to carry out the method. Each block shown in FIG. 15 represents one or more processes, methods, or subroutines carried out in the method. Furthermore, the illustrated order of blocks can be changed. Additional blocks may be added or fewer blocks may be utilized, without departing from this disclosure. The third embodiment method can begin at block 51.

At block 51, referring to FIG. 3, a single-sided metal-clad laminate 10 including an insulating layer 11 and a metal foil 13 formed om a side of the insulating layer 11 is provided, a first photosensitive film 15 is pressed on a side of the metal foil 13 facing away from the insulating layer 11, and is exposed and etched to form at least one first groove 150. A portion of the metal foil 13 is exposed from the at least one first groove 150.

Figure 16:
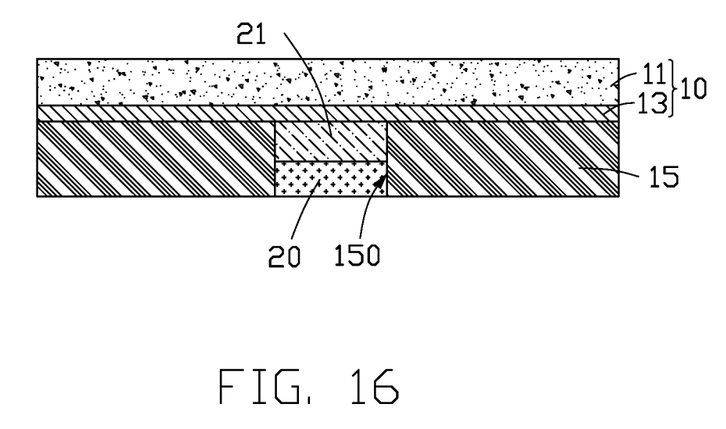
FIG. 16 is a cross-sectional view showing a metal bar and a tin bar in each of the at least one first groove of FIG. 3.
Figure 17:
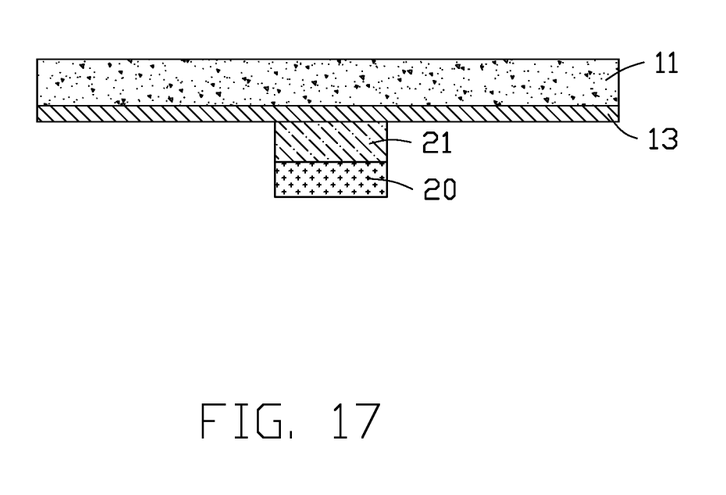
FIG. 17 is a cross-sectional view showing the first photosensitive film removed from the single-sided metal-clad laminate of FIG. 16.

At block 52, referring to FIGS. 16 and 17, a metal bar 21 and a tin bar 20 are sequentially stacked in each of the at least one first groove 150 by plating, and then the first photosensitive film 15 is removed.

In at least one embodiment, the tin bar 20 preferably does not protrude from the first groove 150 receiving the tin bar 20, which is beneficial to the flatness of a shape of the tin bar 20. In at least one embodiment, a surface of the tin bar 20 facing away from the metal foil 13 may be flush with a surface of the first photosensitive film 15 facing away from the metal foil 13.

The metal bar 21 may be made of nickel. A material of the metal bar 21 is different from tin bar 20 and a material of the metal pad 23 formed later.

Figure 18:
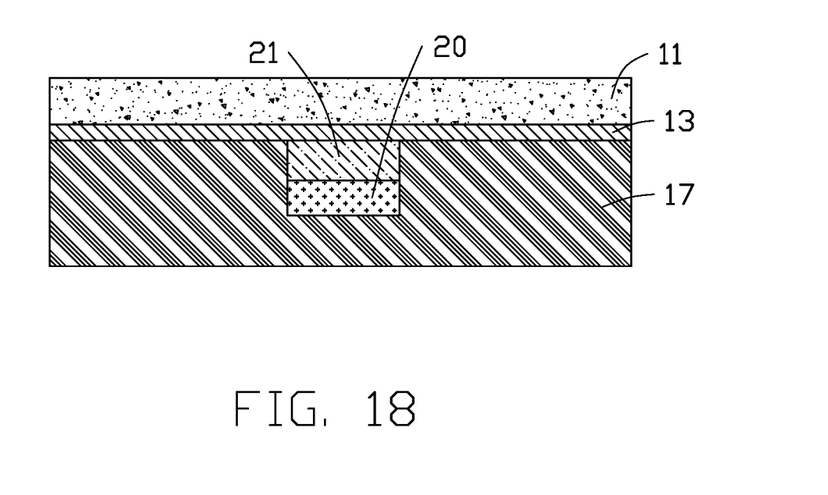
FIG. 18 is a cross-sectional view showing a second photosensitive film on single-sided metal-clad laminate of FIG. 17.

At block 53, referring to FIG. 18, a second photosensitive film 17 is pressed on the side of the metal foil 13 facing away from the insulating layer 11. The tin bar 20 and the metal bar 21 are covered by the second photosensitive film 17.

Figure 19:
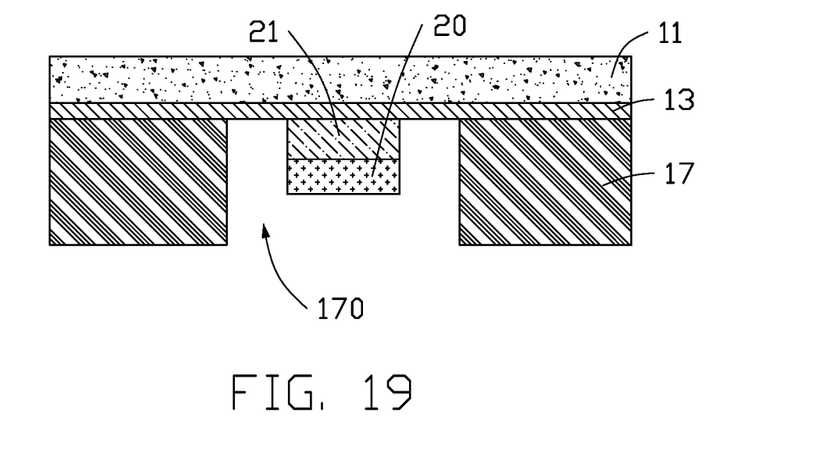
FIG. 19 is a cross-sectional view showing a second groove on the second photosensitive film of FIG. 18.

At block 54, referring to FIG. 19, the second photosensitive film 17 is exposed and etched to form a second groove 170 corresponding each tin bar 20. The tin bar 20 is exposed from the second groove 170, and the tin bar 20 and the metal bar 21 are spaced from the exposed and etched second photosensitive film 17. In at least one embodiment, the metal bar 21 may be not spaced from the exposed and etched second photosensitive film 17.

Figure 20:
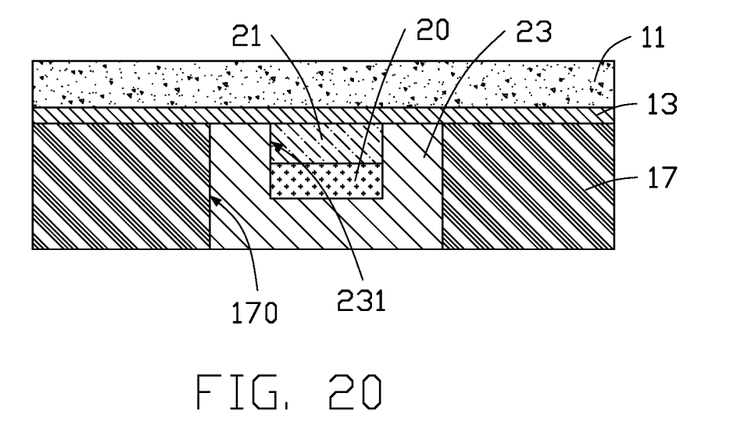
FIG. 20 is a cross-sectional view showing a metal pad in the second groove of FIG. 19.

At block 55, referring to FIG. 20, a metal pad 23 is formed in the second groove 170 by plating metal. The metal pad 23 fills between the tin bar 20 and the second photosensitive film 17 and covers the tin bar 20 thereby forming a recess 231 to wrap the tin bar 20.

When the metal bar 21 is spaced from the exposed and etched second photosensitive film 17, the metal pad 23 further fills between the metal bar 21 and the second photosensitive film 17 and further covers the metal bar 21. The recess 231 further wraps the metal bar 21.

Figure 21:
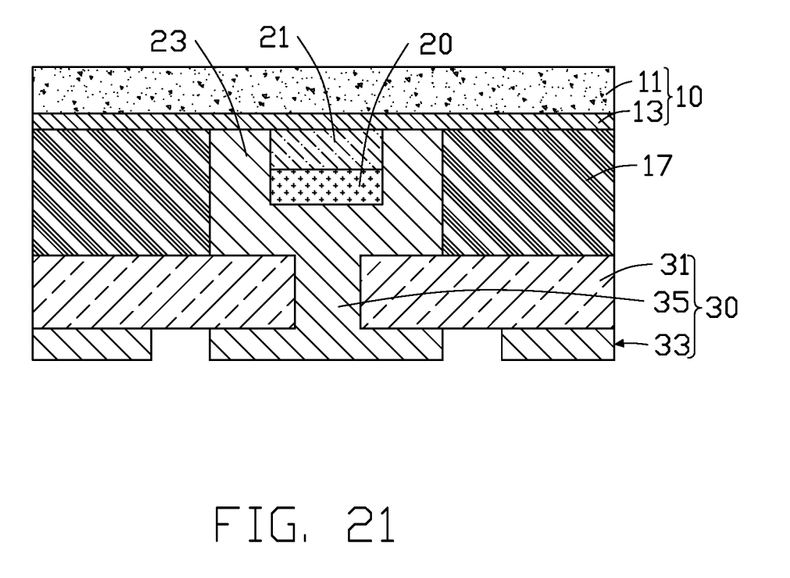
FIG. 21 is a cross-sectional view showing a circuit substrate on the second photosensitive film of FIG. 20.

At block 56, referring to FIG. 21, a circuit substrate 30 is formed on a side of the second photosensitive film 17 facing away from the single-sided metal-clad laminate 10 to be connected to metal pad 23.

In at least one embodiment, the circuit substrate 30 may include a dielectric layer 31, a wiring layer 33, and a conductive pillar 35. The dielectric layer 31 is interposed between the wiring layer 33 and the second photosensitive film 17. The conductive pillar 35 is buried in the dielectric layer 31 and electrically connects the wiring layer 33 and the metal pad 23.

Figure 22:
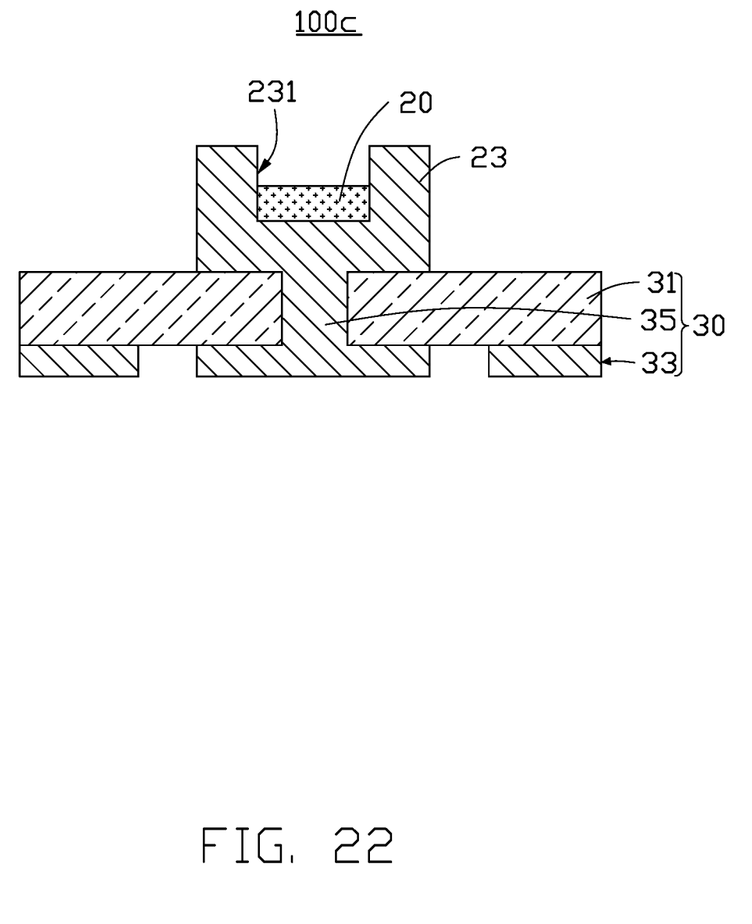
FIG. 22 is a cross-sectional view of a third embodiment of a circuit board according to the present disclosure.

At block 57, referring to FIG. 22, the single-sided metal-clad laminate 10, the second photosensitive film 17, and the metal bar 21 on the circuit substrate 30 are removed, thereby obtaining the circuit board 100c.

The metal bar 21 may be removed by etching.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

FIG. 10 illustrates an embodiment of a circuit board 100a. The circuit board 100a includes a circuit substrate 30, at least one metal pad 23, and a tin bar 20 corresponding to each of the at least one metal pad 23.

The circuit substrate 30 includes a dielectric layer 31, a wiring layer 33, and a conductive pillar 35. The dielectric layer 31 is interposed between the wiring layer 33 and the at least one metal pad 23. The conductive pillar 35 is buried in the dielectric layer 31 and electrically connects the wiring layer 33 and the metal pad 23.

A surface of the metal pad 23 facing away from the circuit substrate 30 is recessed toward the circuit substrate 30 to from a recess 231. The tin bar 20 is received in the recess 231.

Figure 14:
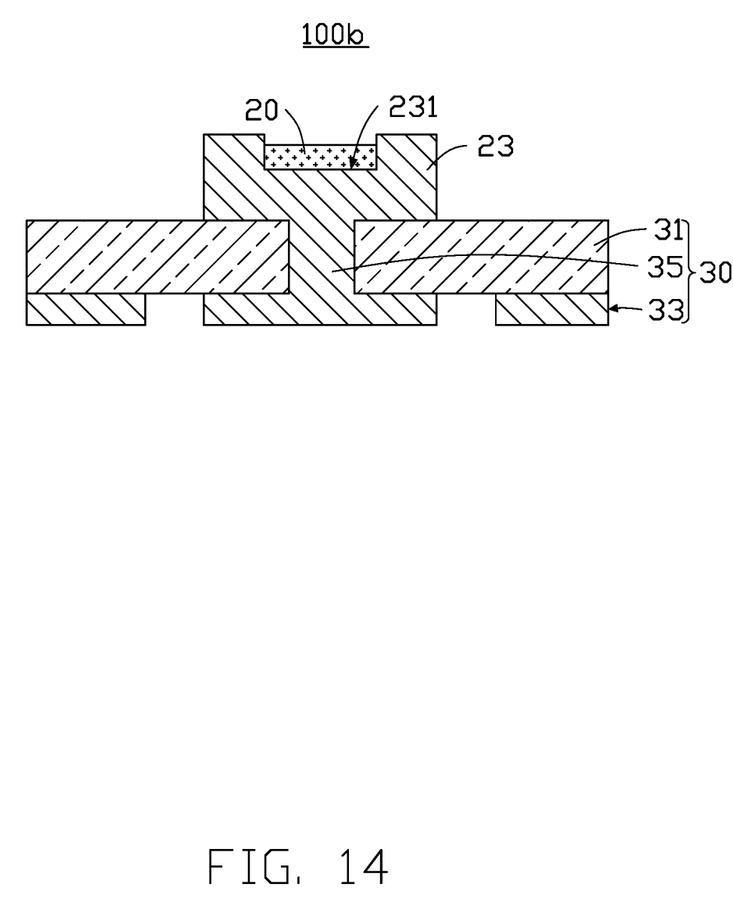
FIG. 14 is a cross-sectional view of a second embodiment of a circuit board according to the present disclosure.

In at least one embodiment, referring to FIGS. 14 and 22, a height of the tin bar 20 is less than a depth of the recess 231. In at least one embodiment, referring to FIG. 10, a surface of the tin bar 20 facing away from the circuit substrate 30 may be flush with the surface of the metal pad 23 facing away from the circuit substrate 30.

The surface of the tin bar 20 facing away from the circuit substrate 30 is flat, which is beneficial to a stability of a soldering of the tin bar 20 with external components.

The surface of the metal pad 23 facing away from the circuit substrate 30 is flat, which is also beneficial to the stability of the soldering of the tin bar 20 with external components.

In the above method of for manufacturing a circuit board and the above circuit board, the tin bar 20 may be accurately arranged on the metal pad 23, and the tin bar 20 is embedded in the metal pad 23, which is beneficial to improve a stability of the connection between the tin bar 20 and the metal pad 23, and at the same time prevents the tin bar 20 from contacting other wirings.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board comprising:
a circuit substrate;
at least one metal pad; and
a tin bar corresponding to each of the at least one metal pad;
wherein each of the at least one metal pad is formed on a side of the circuit substrate and is electrically connected to the circuit substrate, a recess recessed toward the circuit substrate is defined on a surface of each of the metal pad facing away from the circuit substrate, and the tin bar is received in the recess, a height of the tin bar is less than a depth of the recess or a surface of the tin bar facing away from the circuit substrate is flush with the surface of the metal pad facing away from the circuit substrate.

2. The circuit board of claim 1, wherein the circuit substrate comprises a dielectric layer, a wiring layer, and a conductive pillar, the dielectric layer is interposed between the wiring layer and the at least one metal pad, the conductive pillar is buried in the dielectric layer and electrically connects the wiring layer and the metal pad.

3. A method for manufacturing a circuit board comprising:
providing a single-sided metal-clad laminate comprising an insulating layer and a metal foil formed on a side of the insulating layer;
pressing a first photosensitive film on a side of the metal foil facing away from the insulating layer, and exposing and etching the first photosensitive film to form at least one first groove, wherein a portion of the metal foil is exposed from the at least one first groove;
forming a tin bar in each of the at least one first groove by plating tin, and removing the first photosensitive film;
pressing a second photosensitive film on the side of the metal foil facing away from the insulating layer, wherein the tin bar is covered by the second photosensitive film;
exposing and etching the second photosensitive film to form a second groove corresponding each of the tin bar, wherein the tin bar is exposed from the second groove, and the tin bar is spaced from the exposed and etched second photosensitive film;
forming a metal pad in the second groove by plating metal, wherein the metal pad fills between the tin bar and the second photosensitive film, the metal pad covers the tin bar thereby forming a recess to wrap the tin bar;
forming a circuit substrate on a side of the second photosensitive film facing away from the single-sided metal-clad laminate to be connected to metal pad; and
removing the single-sided metal-clad laminate and the second photosensitive film on the circuit substrate.

4. The method of claim 3, wherein after removing the single-sided metal-clad laminate and the second photosensitive film on the circuit substrate, the method further comprising:

removing a portion of the tin bar to reduce a thickness of the tin bar.

5. The method of claim 3, wherein the method of forming a tin bar in each of the at least one first groove by plating tin, and removing the first photosensitive film further comprises forming a metal bar and a tin bar are sequentially stacked in each of the at least one first groove by plating, and removing the first photosensitive film; and
  wherein after removing the single-sided metal-clad laminate and the second photosensitive film on the circuit substrate, the method further comprising removing the metal bar, thereby exposing the tin bar.

6. The method of claim 5, wherein if the metal bar and the tin bar are formed sequentially stacked in each of the at least one first groove by plating, the metal bar is spaced from the exposed and etched second photosensitive film; and if the metal pad is formed in the second groove, the recess wraps the tin bar and the metal bar.

7. The method of claim 5, wherein a material of the metal bar is different from the tin bar and a material of the metal pad.

8. The method of claim 3, wherein the method of forming a circuit substrate on a side of the second photosensitive film facing away from the single-sided metal-clad laminate to be connected to metal pad further comprising:
  pressing a dielectric layer on a side of the second photosensitive film facing away from the single-sided metal-clad laminate, and forming a connecting hole corresponding each metal pad on the dielectric layer to expose a portion of the metal pad;
  forming a conductive pillar in the connecting hole to fill the connecting hole and be connected to the metal pad; and
  forming a wiring layer on a side of the dielectric layer facing away from the second photosensitive film, wherein the wiring layer is electrically connected to the conductive pillar.

9. The method of claim 3, wherein a height of the tin bar is less than or equal to a depth of the first groove receiving the tin bar.

* * * * *